(12) United States Patent
Fukumoto

(10) Patent No.: US 9,485,850 B2
(45) Date of Patent: Nov. 1, 2016

(54) CIRCUIT DEVICE AND METHOD OF MANUFACTURING THE SAME

(71) Applicant: Murata Manufacturing Co., Ltd., Nagaokakyo-shi, Kyoto-fu (JP)

(72) Inventor: Mitsuteru Fukumoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 359 days.

(21) Appl. No.: 13/951,603

(22) Filed: Jul. 26, 2013

(65) Prior Publication Data

US 2014/0085841 A1 Mar. 27, 2014

(30) Foreign Application Priority Data

Sep. 25, 2012 (JP) .................. 2012-210257

(51) Int. Cl.
*H05K 1/02* (2006.01)
*H01L 21/64* (2006.01)
(Continued)

(52) U.S. Cl.
CPC ............ *H05K 1/0201* (2013.01); *H01L 21/64* (2013.01); *H05K 1/0203* (2013.01); *H05K 3/3447* (2013.01); *H01L 23/34* (2013.01); *H01L 2924/0002* (2013.01); *H05K 2201/10522* (2013.01); *H05K 2201/10757* (2013.01)

(58) Field of Classification Search
CPC ............ H05K 1/0203; H05K 3/3447; H05K 1/0201; H05K 2201/10522; H05K 2201/10757; H01L 21/64; H01L 23/34; H01L 2924/0002; H01L 2924/00
USPC .................. 337/4, 5, 295; 361/104
See application file for complete search history.

(56) References Cited

U.S. PATENT DOCUMENTS

| | | | | |
|---|---|---|---|---|
| 5,708,553 A | * | 1/1998 | Hung .................. | H01C 7/13 337/114 |
| 5,990,779 A | * | 11/1999 | Katsuki .............. | H01C 1/1406 174/549 |
| 6,211,770 B1 | * | 4/2001 | Coyle .................. | H01C 7/126 338/101 |

(Continued)

FOREIGN PATENT DOCUMENTS

JP    48 73237 U    10/1973
JP    58-193441 U    12/1983

(Continued)

OTHER PUBLICATIONS

JP 5-41127, Jun. 1, 1993, English machine translation.*

(Continued)

*Primary Examiner* — Anatoly Vortman
(74) *Attorney, Agent, or Firm* — Keating & Bennett, LLP

(57) ABSTRACT

A circuit device includes a heat detection component including lead terminals and a heat detection element, a heat-generating electronic component including lead terminals, and a substrate including a wiring pattern, holes, and lands, the heat detection component and the heat-generating electronic component being electrically connected to the substrate through the lead terminals thereof, wherein the lead terminals of the heat detection component are bent into a U-shaped or substantially U-shaped configuration such that the bent lead terminals are partly contacted with the heat-generating electronic component, and the heat-generating electronic component is sandwiched between portions of the lead terminals and the heat detection element of the heat detection component.

10 Claims, 3 Drawing Sheets

(51) Int. Cl.
   *H05K 3/34*   (2006.01)
   *H01L 23/34*   (2006.01)

(56) References Cited

U.S. PATENT DOCUMENTS 6,252,488 B1 * 6/2001 Ziegler .................. H01C 7/102
                                                       337/2
6,636,403 B2 * 10/2003 McLoughlin .......... H01C 7/126
                                                       337/5
7,728,709 B2 * 6/2010 Grunbichler ........... H01C 7/126
                                                       337/4
7,741,946 B2 * 6/2010 Ho ......................... H01C 7/102
                                                       337/405

FOREIGN PATENT DOCUMENTS

JP          5-41127 U      6/1993
JP       2000-286106 A    10/2000

OTHER PUBLICATIONS

JP 2000-286106, Oct. 13, 2000, English machine translation.*
Official Communication issued in corresponding Japanese Patent Application No. 2012-210257, mailed on Aug. 26, 2014.

* cited by examiner

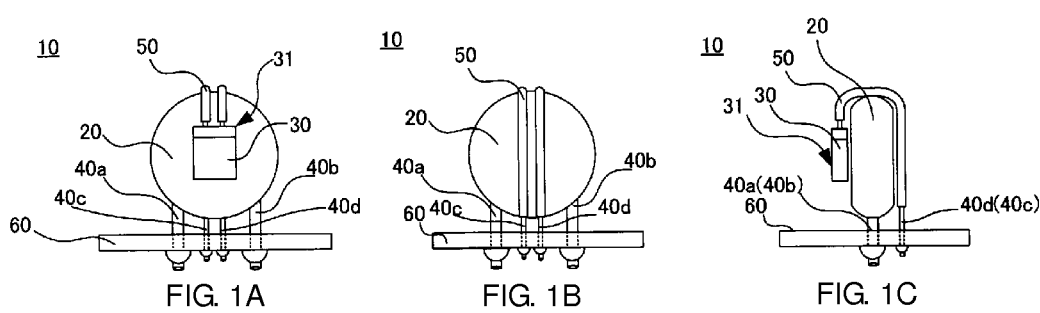

CIRCUIT DEVICE AND METHOD OF MANUFACTURING THE SAME

BACKGROUND OF THE INVENTION

1. Field of the Invention

The present invention relates to a circuit device including a heat-generating electronic component and a heat detection component, and to a method of manufacturing the circuit device.

2. Description of the Related Art

As a circuit device including a heat-generating electronic component and a heat detection component, there is generally known a circuit device including a heat-generating electronic component, such as a varistor, a semiconductor device, or a transformer, and a heat detection component, such as a temperature fuse for detecting a change in heat generated by the heat-generating electronic component and protecting it. In the circuit device of the above-mentioned type, the heat-generating electronic component and the heat detection component are arranged in a positional relationship such that the heat detection component is close to the heat-generating electronic component, in order that the heat detection component may quickly detect heat as soon as the heat-generating electronic component generates the heat. Japanese Unexamined Utility Model Registration Application Publication No. 58-193441 discloses one example of a related-art circuit device including a heat-generating electronic component and a heat detection component. In the related-art circuit device, a transistor as the heat-generating electronic component and a temperature fuse as the heat detection component are mounted in a close relation state where the temperature fuse is contacted with a resin molded portion of the transistor. Thus, it is regarded as important to maintain the above-mentioned close positional relationship when the heat-generating electronic component and the heat detection component of the circuit device are mounted.

Meanwhile, in consideration of influences upon environmental loads in recent years, materials having high melting temperatures, such as lead-free solder, have been primarily used for connection of circuit components instead of using leaded solder. Accordingly, when mounting the heat detection component by employing the solder flow technique that requires the heat detection component to be dipped in the solder for a relatively long time, heat is conducted to a heat detection element through lead terminals of the heat detection component, thus resulting in a possibility that characteristics of the heat detection element may degrade, or that the function of the heat detection element may be lost. For that reason, it has been difficult to carry out integral mounting of the heat detection component and the heat-generating electronic component by employing the solder flow technique.

In addition, when the integral mounting of the heat-generating electronic component and the heat detection component is carried out using the solder flow technique, there has been a possibility that the lead terminals of the heat detection component may be bent due to the weight of the heat detection element itself, and that the close positional relationship between the heat-generating electronic component and the heat detection component may no longer be maintained.

SUMMARY OF THE INVENTION

Preferred embodiments of the present invention provide a circuit device and a method of manufacturing the circuit device, in which a heat-generating electronic component and a heat detection component can be integrally mounted using the solder flow technique, and a close positional relationship between the heat-generating electronic component and the heat detection component can be maintained even after the mounting.

According to a preferred embodiment of the present invention, a circuit device includes a heat detection component having lead terminals and a heat detection element, a heat-generating electronic component including lead terminals, and a substrate including a wiring pattern, holes, and lands, the heat detection component and the heat-generating electronic component being electrically connected to the substrate through the lead terminals thereof, wherein the lead terminals of the heat detection component are bent into a U-shaped or substantially U-shaped configuration such that the bent lead terminals are partly contacted with the heat-generating electronic component, and the heat-generating electronic component is sandwiched between portions of the lead terminals and the heat detection element of the heat detection component.

According to another preferred embodiment of the present invention, a method of manufacturing a circuit device includes a step of preparing a heat detection component including lead terminals and a heat detection element, a heat-generating electronic component including lead terminals, and a substrate including a wiring pattern, holes, and lands, a step of bending the lead terminals of the heat detection component into a U-shaped or substantially U-shaped configuration, a step of inserting the lead terminals of the heat-generating electronic component to the holes of the substrate and holding the heat-generating electronic component on the substrate with the lead terminals of the heat-generating electronic component being projected from the lands, a step of inserting the lead terminals of the heat detection component to the holes of the substrate such that the heat-generating electronic component is sandwiched between the lead terminals and the heat detection element of the heat detection component, and holding the heat detection component on the substrate with the lead terminals of the heat detection component being projected from the lands, and a step of soldering the respective lead terminals of the heat-generating electronic component and the heat detection component to the lands of the substrate by using a solder flow technique.

With the circuit device according to one preferred embodiment of the present invention, the close positional relationship between the heat-generating electronic component and the heat detection component can be maintained reliably.

With the method of manufacturing the circuit device, according to another preferred embodiment of the present invention, the integral mounting of the heat-generating electronic component and the heat detection component using the solder flow technique can be realized.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a front view of a circuit device according to a first preferred embodiment of the present invention, FIG. 1B is a rear view of the circuit device, and FIG. 1C is a side view of the circuit device.

DETAILED DESCRIPTION OF THE PREFERRED EMBODIMENTS

Figure 2A:
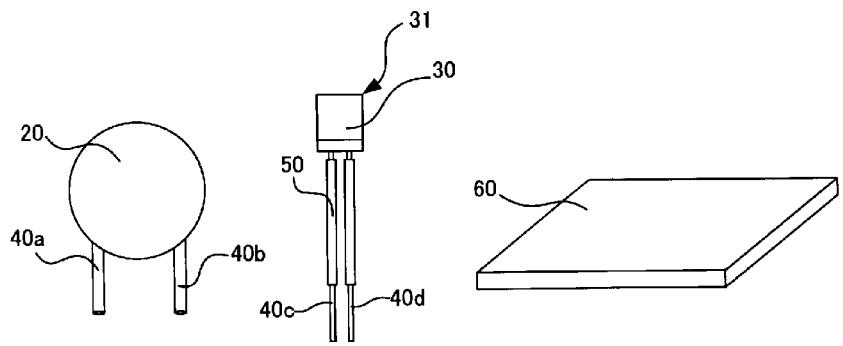
FIGS. 2A, 2B, 2C and 2D illustrate successive manufacturing steps for the circuit device according to the first preferred embodiment of the present invention.

Preferred embodiments of the present invention will be described below with reference to the drawings.

First Preferred Embodiment

FIGS. 1A, 1B and 1C illustrate a circuit device 10 according to a first preferred embodiment of the present invention.

As illustrated in FIGS. 1A, 1B and 1C, the circuit device 10 according to the first preferred embodiment includes a heat-generating electronic component 20 including lead terminals 40a and 40b, a heat detection component 31 including lead terminals 40c and 40d and a heat detection element 30, and a substrate 60 including a wiring pattern, holes, and lands. Additionally, the lead terminals 40c and 40d are coated with an insulating resin 50.

The heat-generating electronic component 20 is bonded to the substrate 60 through the lead terminals 40a and 40b using solder. The heat detection component 31 is bonded to the substrate 60 through the lead terminals 40c and 40d using solder in a state sandwiching the heat-generating electronic component 20 between the lead terminals 40c, 40d and the heat detection element 30. The lead terminals 40c and 40d are bent into a U-shaped or substantially U-shaped configuration such that the lead terminals 40c and 40d are partly contacted with the heat-generating electronic component 20.

While, in the first preferred embodiment, the heat detection element 30 is preferably held at a central position of the heat-generating electronic component 20 as illustrated in FIG. 1A, the heat detection element 30 may be held at a location spaced away from the central position of the heat-generating electronic component 20. Furthermore, while the lead terminals 40c and 40d are covered with the insulating resin 50 to increase insulation with respect to other components, the insulating resin 50 may be omitted in some cases, and insulation with respect to the other components may be ensured using an insulating tape or sheet instead of the insulating resin 50.

Second Preferred Embodiment

Figure 3:
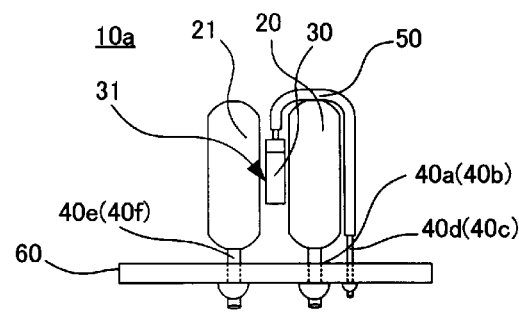
FIG. 3 is a side view of a circuit device according to a second preferred embodiment of the present invention.

FIG. 3 illustrates a circuit device 10a according to a second preferred embodiment of the present invention. The circuit device 10a according to the second preferred embodiment includes a heat-generating electronic component 20 including lead terminals 40a and 40b, a heat detection component 31 including lead terminals 40c and 40d and a heat detection element 30, another electronic component 21 including lead terminals 40e and 40f, and a substrate 60 having a wiring pattern, holes, and lands. Additionally, the electronic component 21 may be a heat-generating electronic component.

The heat-generating electronic component 20 is bonded to the substrate 60 through the lead terminals 40a and 40b using solder. The heat detection component 31 is bonded to the substrate 60 through the lead terminals 40c and 40d using solder in a state sandwiching the heat-generating electronic component 20 between the lead terminals 40c, 40d and the heat detection element 30. The electronic component 21 is bonded to the substrate 60 through the lead terminals 40e and 40f using solder at a position close to the heat detection element 30 with a short distance between them.

With such an arrangement, since the heat detection component 31 is surrounded by the heat-generating electronic component 20 and the electronic component 21, the heat detection component 31 can be held in place with higher reliability. Moreover, in the circuit device 10a, when the electronic component 21 is a heat-generating electronic component, heat generated from two heat generating sources can be detected by one heat detection component 31.

Third Preferred Embodiment

Figure 4:
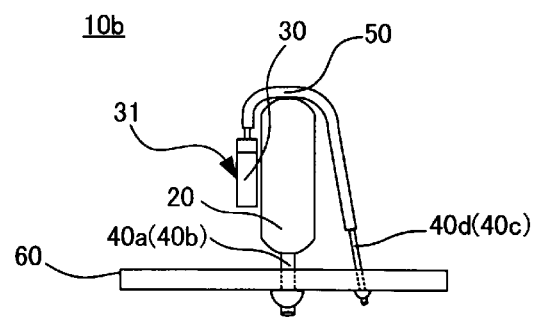
FIG. 4 is a side view of a circuit device according to a third preferred embodiment of the present invention.

FIG. 4 illustrates a circuit device 10b according to a third preferred embodiment of the present invention. The third preferred embodiment is similar in basic structure to the first preferred embodiment except that the spacing between the heat-generating electronic component 20 and the heat detection component 31 is increased in the third preferred embodiment. Stated in another way, while the lead terminals 40c and 40d of the heat detection component 31 are vertically inserted to the holes in the substrate 60 in the first preferred embodiment, the lead terminals 40c and 40d are obliquely inserted to the holes in the substrate 60 and are connected the substrate 60 using solder in the third preferred embodiment.

Even when the spacing between the heat-generating electronic component 20 and the heat detection component 31 is increased as in the third preferred embodiment, the heat detection element 30 and the heat-generating electronic component 20 can be maintained in the close positional relationship.

A method of manufacturing the circuit device, according to another preferred embodiment of the present invention, will be described below in connection with, for example, the above-described circuit device 10 according to the first preferred embodiment. FIGS. 2A, 2B, 2C and 2D illustrate successive manufacturing steps for the circuit device according to the first preferred embodiment.

First, the substrate 60, the heat-generating electronic component 20, and the heat detection component 31, each illustrated in FIG. 2A, are prepared.

Figure 2B:
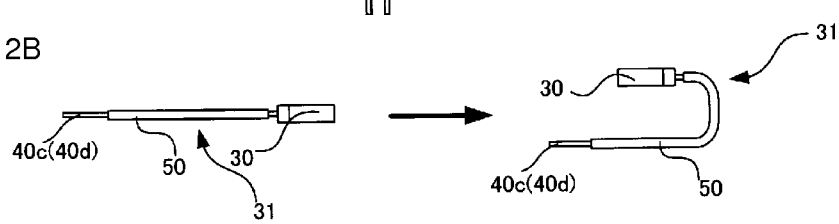

Next, as illustrated in FIG. 2B, the lead terminals 40c and 40d of the heat detection component 31 are bent into a U-shaped or substantially U-shaped configuration such that the lead terminals 40c and 40d are positioned opposite to the heat detection element 30. Since the lead terminals 40c and 40d are maintained in the U-shaped or substantially U-shaped configuration with the above-described step, relatively long lead terminals can be used. As a result, when the heat detection component 31 is mounted using solder, generated heat is less transferable to the heat detection element 30 through the lead terminals 40c and 40d.

Figure 2C:
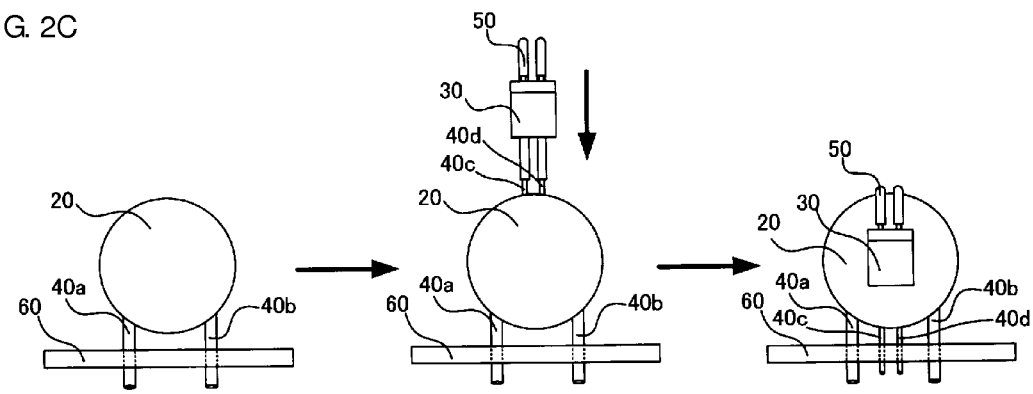

Next, as illustrated in FIG. 2C, the heat-generating electronic component 20 is held on the substrate 60. More specifically, the lead terminals 40a and 40b of the heat-generating electronic component 20 are inserted to the holes in the substrate 60, and the heat-generating electronic component 20 is held on the substrate 60 in such a state that the lead terminals 40a and 40b project from the lands of the substrate 60.

Furthermore, the heat detection component 31 is held on the substrate 60. More specifically, the lead terminals 40c and 40d of the heat detection component 31 are inserted to the holes in the substrate 60 in a state sandwiching the heat-generating electronic component 20 between the heat detection element 30 and the lead terminals 40c, 40d of the heat detection component 31. The heat detection component 31 is then held on the substrate 60 in such a state that the lead terminals 40c and 40d project from the lands of the substrate 60. On that occasion, the lead terminals 40c and 40d of the heat detection component 31 are partly contacted with the heat-generating electronic component 20. Thus, because the heat detection component 31 sandwiches the heat-generating electronic component 20 between the lead terminals 40c, 40d and the heat detection element 30 thereof, the heat detection component 31 can be held on the substrate 60 with higher reliability. As a result, a jig for holding the heat detection component 31 in place is no longer required.

Figure 2D:
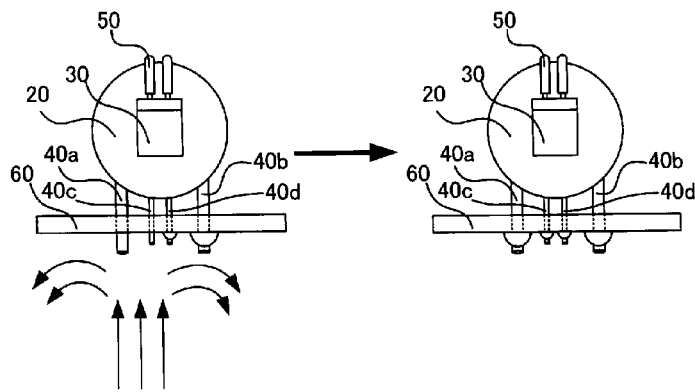

Next, as illustrated in FIG. 2D, the circuit device 10 including the heat-generating electronic component 20 and the heat detection component 31, both held on the substrate 60, is moved to pass through a solder flow apparatus in which solder is circulated to flow in a jet stream. As a result, the lead terminals 40a and 40b of the heat-generating electronic component 20 and the lead terminals 40c and 40d of the heat detection component 31 are soldered to the lands of the substrate 60.

Through the above-described steps, the circuit device 10 according to the first preferred embodiment of the present invention is completed.

The heat-generating electronic component 20 used in preferred embodiments of the present invention is, for example, a varistor, a semiconductor device, or a transformer. The present invention can be applied to other types of heat-generating electronic components as well.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit device comprising:
    a heat detection component including lead terminals and a heat detection element;
    a heat-generating electronic component including lead terminals; and
    a substrate including a wiring pattern, holes, and lands; wherein
    the heat detection component and the heat-generating electronic component are electrically connected to the substrate through the lead terminals thereof;
    the lead terminals of the heat detection component are bent into a U-shaped or substantially U-shaped configuration such that the lead terminals include bent U-shaped portions and are partly contacted with the heat-generating electronic component, and such that the heat detection component detects a temperature of the heat-generating electronic component; and
    the heat-generating electronic component is sandwiched between the bent U-shaped portions of the lead terminals of the heat detection component and the heat detection element of the heat detection component.

2. The circuit device according to claim 1, wherein the lead terminals of the heat detection component are covered with an insulating resin.

3. The circuit device according to claim 1, wherein the heat detection component is a temperature fuse.

4. The circuit device according to claim 1, wherein the heat-generating electronic component is one of a varistor, a semiconductor device, and a transformer.

5. The circuit device according to claim 1, wherein
    the heat detection element is fixed at a central position of the heat-generating electronic component.

6. The circuit device according to claim 1, wherein
    the heat detection element is fixed at position that is spaced away from a central position of the heat-generating electronic component.

7. The circuit device according to claim 1, further comprising a plurality of the heat-generating electronic components arranged such that the heat detection component detects heat emitted by the heat-generating electronic components.

8. The circuit device according to claim 7, wherein the heat detection component is surrounded by the heat-generating electronic components.

9. The circuit device according to claim 1, wherein
    the lead terminals of the heat detection component are vertically inserted to the holes in the substrate.

10. The circuit device according to claim 1, wherein
    the lead terminals of the heat detection component are obliquely inserted to the holes in the substrate.

* * * * *